United States Patent [19]
Beffa et al.

[11] Patent Number: 6,032,264
[45] Date of Patent: Feb. 29, 2000

[54] APPARATUS AND METHOD IMPLEMENTING REPAIRS ON A MEMORY DEVICE

[75] Inventors: Ray J. Beffa; William K. Waller; Lee R. Nevill, all of Boise; Warren M. Farnworth, Nampa; Eugene H. Cloud, Boise, all of Id.

[73] Assignee: Micron Technology, Inc., Boise, Id.

[21] Appl. No.: 08/837,820

[22] Filed: Apr. 22, 1997

[51] Int. Cl.[7] .............................. G06F 11/20; G06F 11/34
[52] U.S. Cl. ................................. 714/7; 714/770
[58] Field of Search ...................... 371/5.1, 5.3, 10.2, 371/10.3, 21.2, 21.1; 395/182.01, 182.05, 182.04, 182.03, 182.06, 183.06, 183.08; 714/7, 8, 6.5, 3, 770

[56] References Cited

U.S. PATENT DOCUMENTS

| | | | |
|---|---|---|---|
| 4,460,997 | 7/1984 | Harns | 371/10 |
| 4,751,656 | 6/1988 | Conti et al. | 364/488 |
| 5,134,616 | 7/1992 | Barth, Jr. et al. | 371/10.3 |
| 5,406,520 | 4/1995 | Tay | 365/200 |
| 5,406,565 | 4/1995 | MacDonald | 371/10.3 |
| 5,410,687 | 4/1995 | Fujisaki et al. | 395/575 |
| 5,477,492 | 12/1995 | Ohaski et al. | 365/200 |
| 5,519,657 | 5/1996 | Arimoto | 365/200 |
| 5,574,729 | 11/1996 | Kinoshita et al. | 371/10.3 |
| 5,577,050 | 11/1996 | Bais et al. | 371/10.2 |
| 5,598,373 | 1/1997 | Wada et al. | 365/230.03 |
| 5,703,817 | 12/1997 | Shiratake et al. | 365/200 |
| 5,764,878 | 6/1998 | Kablanian et al. | 395/182.05 |
| 5,859,804 | 1/1999 | Hedberg et al. | 365/201 |

*Primary Examiner*—Norman Michael Wright
*Attorney, Agent, or Firm*—Dickstein Shaprio Morin & Oshinsky

[57] ABSTRACT

An on-chip testing device separately locates must-repairs or preferred-repairs in a row direction and column direction of a memory array. A row counter and a column counter are operated to index the memory array in row-major order, and then in column-major order (or vice versa). A running total of the number of failures is kept for each row and column, when the running total equals or exceeds a predetermined value, the row or column is determined to be a must-repair or a preferred repair. Rows to be repaired are substituted with redundant memory rows and columns to be prepared are substituted with redundant memory columns

20 Claims, 7 Drawing Sheets

|  | Row | Row | Row |
|---|---|---|---|
| Column | (0,0) | (1,0) | (2,0) |
| Column | (0,1) | (1,1) | (2,1) |
| Column | (0,2) | (1,2) | (2,2) |

Array(row, column)

APPARATUS AND METHOD IMPLEMENTING REPAIRS ON A MEMORY DEVICE

RELATED APPLICATIONS

This disclosure is related to the application entitled "Self-test of a Memory Device, Ser. No. 08/838,010" invented by Ray Beffa, William Waller, Warren Farnworth, Leland Nevill, and Eugene Cloud, filed on Apr. 22, 1997, the contents of which are hereby incorporated by reference.

BACKGROUND OF THE INVENTION

The present disclosure relates generally to the computer memory field, and more particularly, to on-chip testing of dynamic random access memory (DRAM) semiconductor chips.

A DRAM memory cell (memory bit) is a binary memory element formed with one transistor and one capacitor. A modem DRAM memory unit may contain many millions of addressable memory cells. Each cell's capacitor holds binary information in the form of charge, and the cell's transistor operates as a switch to introduce and control the charge stored on the capacitor.

The memory cells are organized into arrays. To access a particular memory cell when performing a read operation, the operator supplies the DRAM with the address of the cell to be accessed. The DRAM translates the address into a row address and a column address of the array the memory cell is located in, and the addressed column and row are then accessed and the charge stored on the memory cell capacitor at the intersection of the addressed column and row is sensed.

FIG. 1 is a diagram showing a memory cell array map for a 4 Meg×4 DRAM (i.e., a DRAM with sixteen million total bits, accessible in four million, four-bit units). Array maps for other size DRAMs are similar. The DRAM is divided into four quadrants, each made up of a series of rows, such as rows 104 and 106, and columns, such as column 107. The rows in quadrants one and three have addresses extending from zero to 1023, and are accessed four at a time. That is, because each row address in a quadrant is repeated four times, access to any row address drives four physical rows in the accessed quadrant. Each column in a quadrant, such as quadrant three, intersects all four active rows. The column addresses in quadrants one and three extend from zero to 2047. The addressing scheme is similar for quadrants two and four. For each bit that is eventually output by the DRAM, the active column and the active physical rows access four bits in a quadrant. Additional circuitry on the DRAM selects certain of the four accessed bits and places them on the appropriate output data pin(s). In this example, two bits are selected from the physical rows accessed in quadrant three, corresponding to output DQs 2 and 3, and two bits are selected from the physical rows accessed in quadrant one, corresponding to output DQs 1 and 4.

Before shipping a DRAM semiconductor chip, it must be tested to ensure that all the memory cells function properly. One conventional method of testing a DRAM is to have an external testing device store data in every memory cell in the DRAM, and then read out every memory cell in the DRAM. In this manner, DRAM defects can be detected by comparing the known input data to the output data. However, as DRAMs increase in capacity, accessing all the memory cells begins to take an inordinate amount of time. For example, in the case of a 4 Meg×4 DRAM, conventional testing techniques would require four million write cycles and four million read cycles to fully test the DRAM one time.

A second conventional method decreases testing time by taking advantage of the fact that multiple bits are sensed when a row address and a column address are accessed in a quadrant. In this method, circuitry is placed on the DRAM chip, which operates on the multiple data bits sensed for each row and column address. The circuitry transmits a logic one if all the sensed data bits are a logic one, a logic zero if all the sensed data bits are a logic zero, and enters a high impedance state if the data bits are mixed, i.e., both logic ones and zeros.

To perform a DRAM test with the second conventional method, the external testing unit writes either all ones or all zeroes to the row and column addresses to be tested, and then performs a read operation on the addresses. For each address read by the testing unit, the internal DRAM test circuitry outputs a one, zero, or high impedance state, thus informing the testing unit whether any of the bits sensed are bad. By testing a plurality of data bits simultaneously, testing time is reduced.

A goal of both of the above described conventional testing techniques is to replace defective addresses when found. One way to do this is to fabricate the DRAM memory arrays with extra rows and columns of cells, which are normally not used, but which can be substituted for rows or columns of cells found to be defective. In FIG. 1, columns 108, 109 and rows 112, 113 are designated as extra rows and columns, called redundant rows and columns, respectively. For example, a 4 Meg×4 DRAM may have eight redundant rows and four redundant columns per quadrant.

When a defective row or column is found, fuses are blown, isolating the defective row or column and mapping one of the redundant rows 112, 113 or one of the redundant columns 108, 109 to the address previously occupied by the defective row or column. In this manner, a memory array with a limited number of defective memory cells can be completely repaired. However, if there are too many defective memory cells, such that there are not enough redundant rows and columns to completely repair all of the defective memory cells, the die is considered "bad" and may have to be discarded.

It is important that the available supply of redundant rows and columns be allocated efficiently to repair defective memory cells. For example, assuming that X's 110 and 111 in FIG. 1 represent defective memory cells, one could repair these two cells by substituting redundant rows 112 and 113 for rows 104 and 106, respectively, or by substituting only one of redundant columns 108 and 109 for column 107. Obviously, the second substitution is the more efficient way of repairing defective cells 110 and 111, because it repairs two defective cells with only one redundant column. Relative to repairing defective cells 110 and 111 with redundant rows 112 and 113, repairing with one of redundant columns 108 and 109 is called a "preferred-repair." A term related to preferred repairs is the so-called "must-repair". A must repair in the row direction is encountered when the number of bad bits in a row is greater than the number of available redundant columns. Similarly, a must-repair in the column direction refers to the situation that occurs when the number of bad bits in a column is greater than the number of available redundant rows.

A conventional technique for finding must and preferred repairs uses the external testing device discussed above to form a map of the defective memory cells. The device then analyzes this "memory map," finds the required repairs, and implements an optimal repair scheme using redundant row and column substitution. This conventional testing and repair technique requires a sophisticated external testing unit, which spends a significant amount of time testing each DRAM. As DRAM sizes increase, the amount of required testing time proportionality increases. For high volume DRAM manufacture, testing time may become unacceptably long.

There is, therefore, a need to reduce the amount of time each DRAM is connected to a testing unit, and to reduce the amount of time an external testing unit needs to find and repair must and preferred repairs. Additionally, it is desirable to decrease the complexity and expense of external testing units.

SUMMARY OF THE INVENTION

Simple, fast, on-chip self-test circuitry quickly and efficiently finds and substitutes redundant rows and columns for rows and columns that are considered must/preferred repairs. The present invention is particularly advantageous because of its compact design, therefore it requires relatively little semiconductor area on the chip.

The advantages and purposes in accordance with this invention will be set forth in the following description and will also be obvious from the description, or may be learned by practicing the invention. The advantages and purpose of the invention will be realized and attained by means of the elements and combinations particularly pointed out in the appended claims.

To obtain the advantages, and in accordance with the purpose of the invention, as embodied and broadly described herein, in one embodiment, the present invention is in the form of a memory fabricated on a semiconductor chip, comprising a memory array addressable with row and column addresses; a row counter connected to supply row addresses to the memory array; and a column counter connected to supply column addresses to the memory array. Finally, control circuitry is included coupled to the row counter and the column counter, the control circuitry operating the row and column counters to access each memory element in the memory array twice, once in column-major order and once in row-major order.

In another embodiment, the present invention is a method of locating must/preferred repairs orientated in a row direction within a memory array on a semiconductor chip, comprising the steps of: sequentially accessing the memory cells in a row of the memory array; comparing a value of each of the accessed memory cells of the row with test values pre-written to the memory cells of the row; storing a running total of the number of dissimilar comparisons performed by the comparing step; and repeating the sequential accessing, comparing, and storing steps for each row in the memory array.

Both the foregoing general description and the following detailed description are exemplary and explanatory only and do not restrict the invention, as claimed.

BRIEF DESCRIPTION OF THE DRAWINGS

The accompanying drawings, which are incorporated in and constitute a part of this specification, illustrate several embodiments of the invention and, together with the description, serve to explain the principles of the invention. In the drawings.

FIG. 3 is diagram of a nine element array;

DETAILED DESCRIPTION

This disclosure describes self-test circuitry that, when triggered by an external signal, performs an on-chip test and repair of a DRAM memory array. The on-chip circuitry finds and repairs must and preferred repairs on the DRAM. (A preferred-repair is defined as a row or column in which at least a predetermined number of cells, greater than one, have failed. For example, if the predetermined number is set at two, any row or column with two or more failing cells is considered a preferred repair. A must-repair is defined as a row or column in which the number of failing cells is greater than the number of available redundant columns or rows, respectively.) The on-chip test circuitry includes a row counter and a column counter, which index each quadrant in the memory array under test. To find must and preferred repairs in the column direction, the two counters index the memory array in column-major order, and to find must and preferred repairs in the row direction, the indexing is done in row-major order.

Reference will now be made in detail to the embodiments of the invention, examples of which are illustrated in the accompanying drawings. Wherever possible, the same reference numbers will be used throughout the drawings to refer to the same or like parts.

Figure 1:
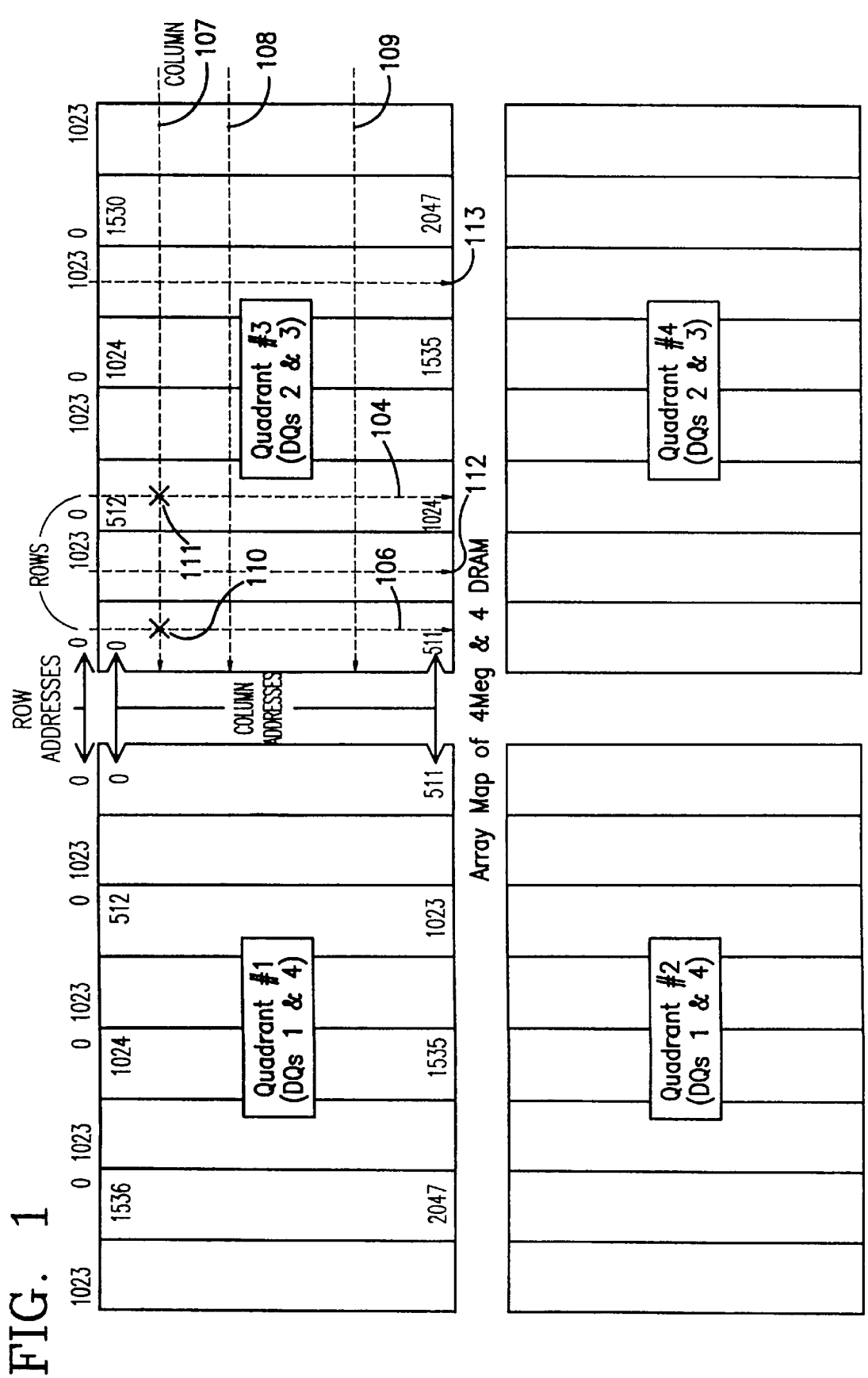
FIG. 1 is a diagram showing a memory cell array map for a 4 Meg×4 DRAM.
Figure 2:
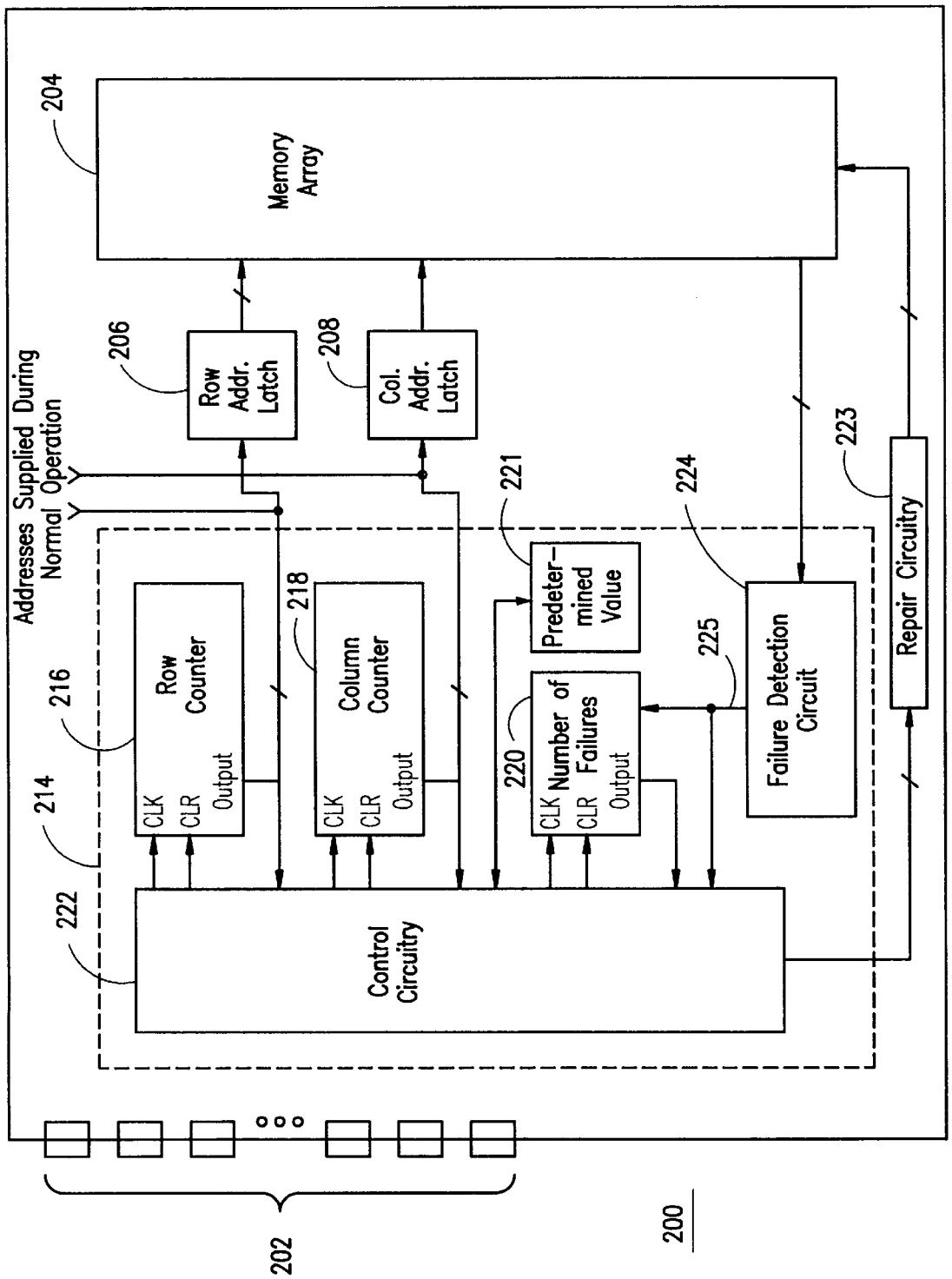
FIG. 2 is a conceptual block diagram illustrating a DRAM with a self-test capability according to the present invention.

A DRAM, equipped with repair location circuitry according to the preferred embodiment of the present invention, seen in FIG. 2, is preferably implemented on semiconductor chip 200, which includes a plurality of pins 202, such as data I/O pins, address pins, and various control pins, for interfacing chip 200 with the outside world. Memory array 204, which may be subdivided into quadrants as shown in FIG. 1, includes memory cells that store data.

During normal DRAM operation, to access data, the operator supplies DRAM 200 with row and column addresses. The row and column addresses are stored in the row address latch 206 and column address latch 208, respectively, and are then used to access data stored in memory array 204. The row address may turn on multiple physical rows having the same address within a segment (e.g., four rows are turned on in the 4 Meg×4 DRAM shown in FIG. 1). The column address determines which one of the data bits sensed on the activated rows should be sent to a DRAM output pin.

Preferably, test circuitry 214, in response to a command from an external testing unit (not shown), writes predetermined test data to memory array 204. Alternatively, other on-chip testing circuitry, or even off-chip testing circuitry may write the predetermined test data to memory array 204. After the predetermined test data have been written to memory array 204, the self-test cycle contemplated by the present invention may be initiated.

Semiconductor chip 200 and test circuitry 214 can include additional control circuitry for interfacing/decoding data and commands with memory array 204. Such control circuitry is well known in the art and will not be described further.

Test circuitry 214 includes a plurality of elements, including a row counter 216, a column counter 218, and a third counter 220. Counters 216 and 218 generate row and column addresses which are latched to the memory array 204 through row address latch 206 and column address latch 208, respectively. The data output from the memory cells addressed by the addresses in latches 206 and 208 are input to failure detection circuit 224, which detects failing, or bad, memory cells by comparing the data read from the memory cells to the "expected" test data previously supplied to memory array 204. When a bad cell is detected, failure detection circuit 224 supplies an error detect signal to register 220 and control circuitry 222 via error detection line 225.

Repair circuitry 223, under control of circuitry 222, contains logic necessary to substitute a designated redundant row or column for a failed row or column. This substitution is typically performed when the number of defective cells in a row or column has reached the predetermined values stored in register 221. When finding must-repairs the predetermined value is initially set at the number of initially available redundant rows or columns, and is gradually decremented to reflect used redundant rows and columns. When finding preferred-repairs, a predetermined value is set in register 221 and held constant throughout the preferred-repair procedure.

Control circuitry 222 coordinated the operation of must-repair location circuitry 214. In particular, control circuitry 222 increments row counter 216 and column counter 218 by pulsing their clock (clk) input, and clears the counters by activating their clear inputs. In this manner, control circuitry 222 controls the particular order in which the row and column counters are operated, called the indexing scheme, used to access memory array 204. Further, in response to an active signal on error detection line 223, control circuitry 222 updates counter 220, which keeps a running total of the number of failures in a particular row or column.

Although counters 216 and 218 are shown as two distinct counters, each controlled by circuitry 222, they could also be implemented as two counters in a cascade configuration or as a larger single counter. Further, counter 220 may be as simple as a memory register used by control circuitry 222 to store the running total.

The operation of text circuitry 214 will be further described below, with reference to FIGS. 3 through 7.

As previously mentioned, according to the present invention, test circuitry 214 first indexes memory array 204 in row-major order and then in column-major order. Indexing an array in row-major order refers to sequentially traversing the array one row at a time; conversely, indexing an array in column-major order refers to sequentially traversing the array one column at a time. For example, array 300, shown in FIG. 3, is a 3×3, nine element array, with each element having a label corresponding to the row and column it intersects. Traversal of the array in row-major order corresponds to sequentially accessing the elements: (0,0), (0,1), (0,2), (1,0), (1,1) (1,2), (2,0), (2,1), and (2,2). Traversal of the array in column-major order corresponds to sequentially accessing the elements: (0,0), (1,0), (2,0), (0,1), (1,1), (2,1), (0,2), (1,2), and (2,2).

Figure 4:
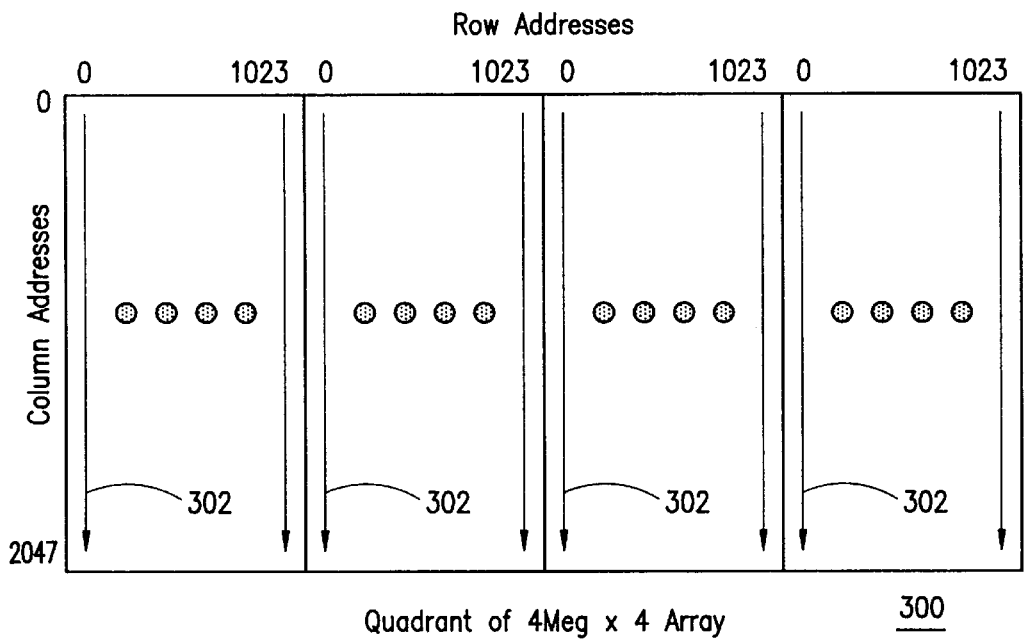
FIG. 4 illustrates a quadrant of a 4 Meg×4 DRAM indexed in row-major order.
Figure 5:
FIG. 5 illustrates a quadrant of a 4 Meg×4 DRAM indexed in column-major order.

FIGS. 4 and 5 illustrate a quadrant 300 of a 4 Meg×4 DRAM indexed in row-major order (FIG. 4) and in column-major order (FIG. 5).

As shown in FIG. 4, when indexing in row-major order, the memory elements along each row, indicated by, for example, row line 302, are sequentially addressed. To perform this type of indexing, for each row, control circuitry 222 holds row counter 216 constant at a single row value, while column counter 218 is incremented through the available column addresses zero through 2047. If any one of the four bits accessed by each indexed row and column address corresponds to a defective bit, as detected by failure detection circuit 224, counter 220 is incremented. At the end of each row, control circuitry 222 compares the value in register 220 to a predetermined value, and if the value held in register 220 equals or exceeds that value, the row just analyzed is determined to be a must-repair or a preferred repair row. The value stored in register 220 is then cleared, and the indexing proceeds to the next row. When checking for must-repairs in the row direction, the predetermined value is set at, and changes with, the number of available redundant columns. When checking for preferred-repairs in the row direction, the predetermined value is held constant at, for example, two, throughout the testing procedure.

FIG. 5 is a diagram illustrating indexing of quadrant 300 in column-major order. This type of indexing is similar to indexing in row-major order, except that the roles of row counter 216 and column counter 218 are reversed. Specifically, in column-major indexing, for each column, control circuitry 222 holds column counter 218 constant at a single column value, while row counter 216 is incremented through the available row addresses zero through 1023.

Figure 6A:
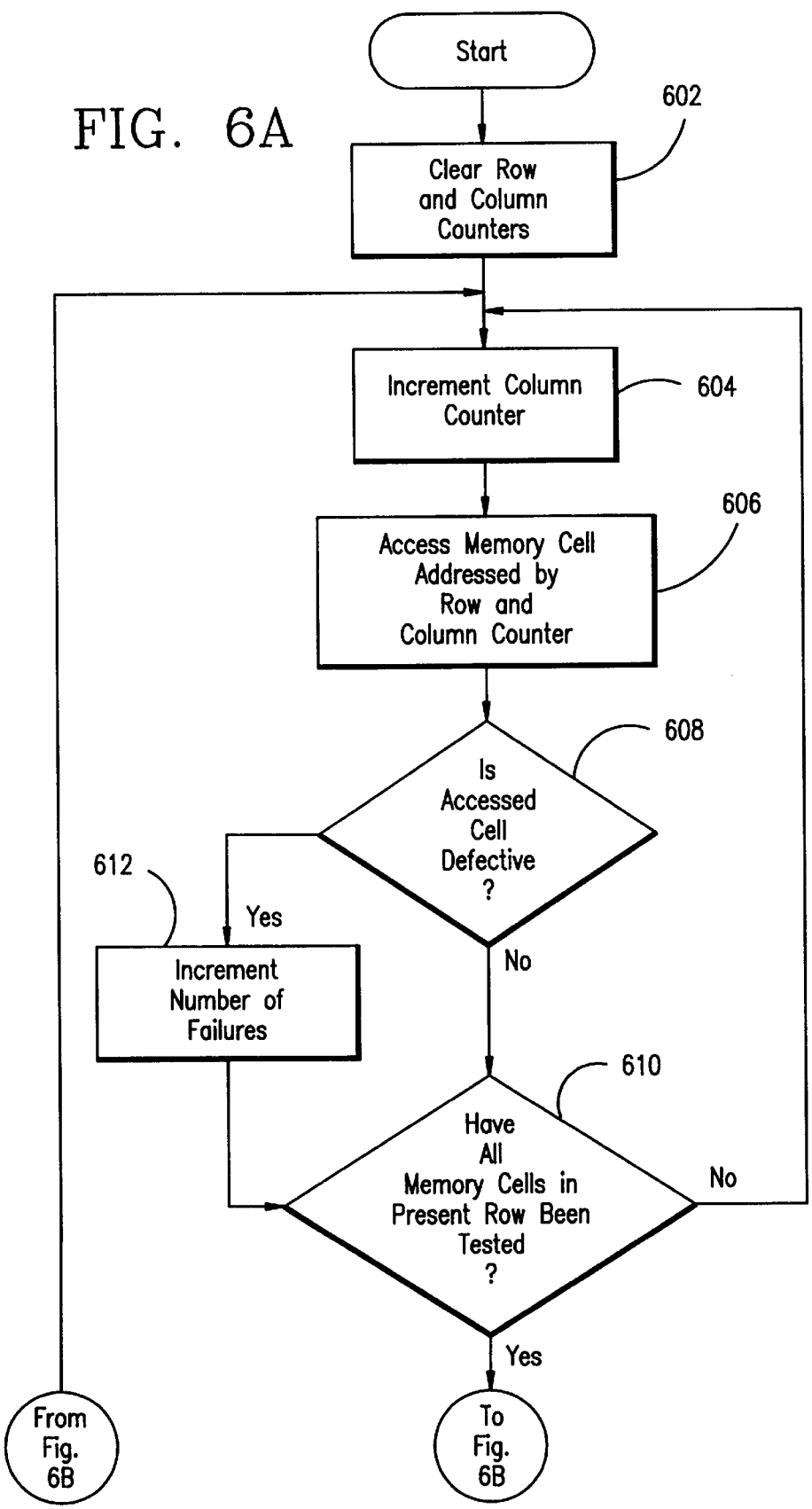
FIGS. 6A, 6B, and 7 are flow-charts illustrating the preferred operation of the present.
Figure 6B:
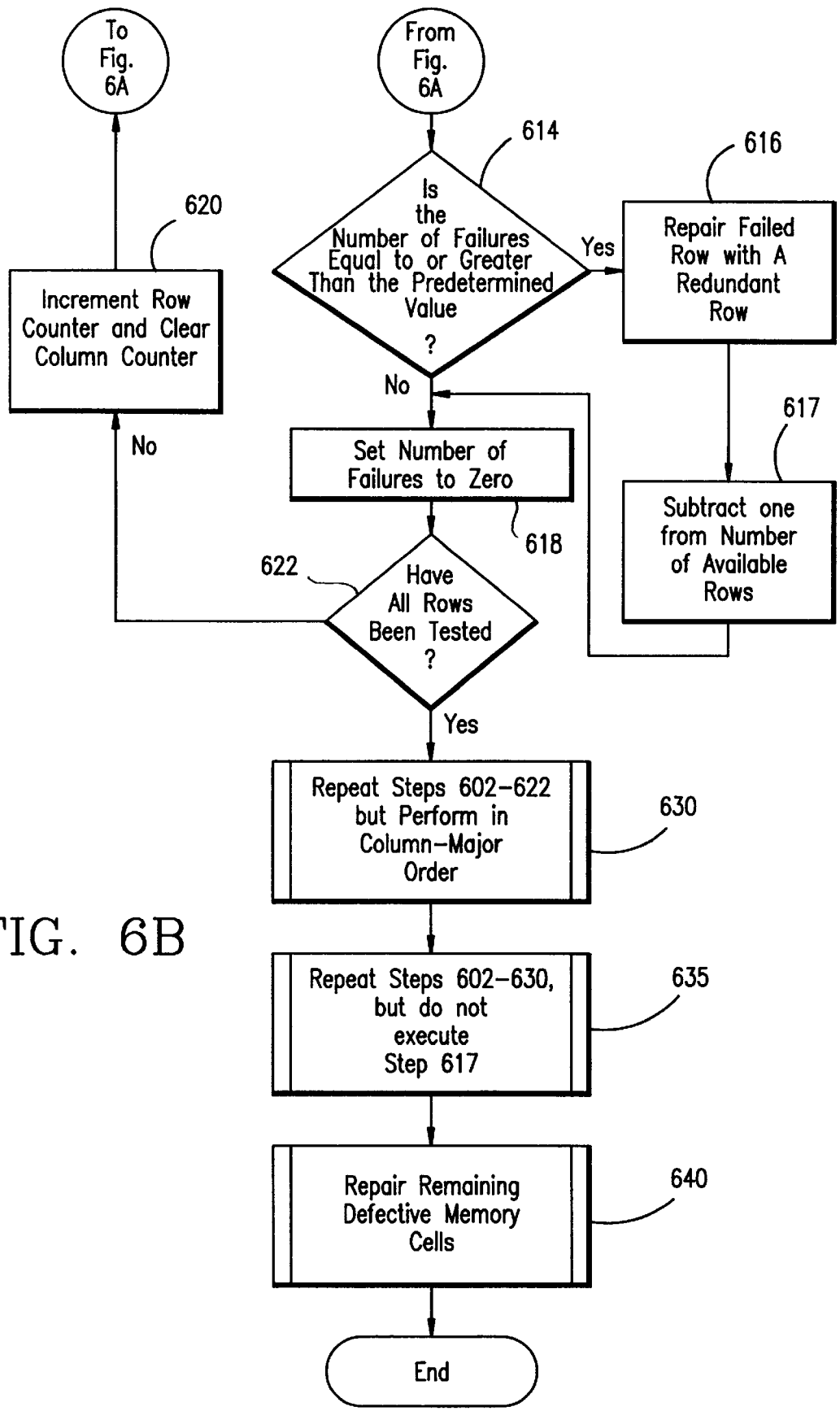
Figure 7:
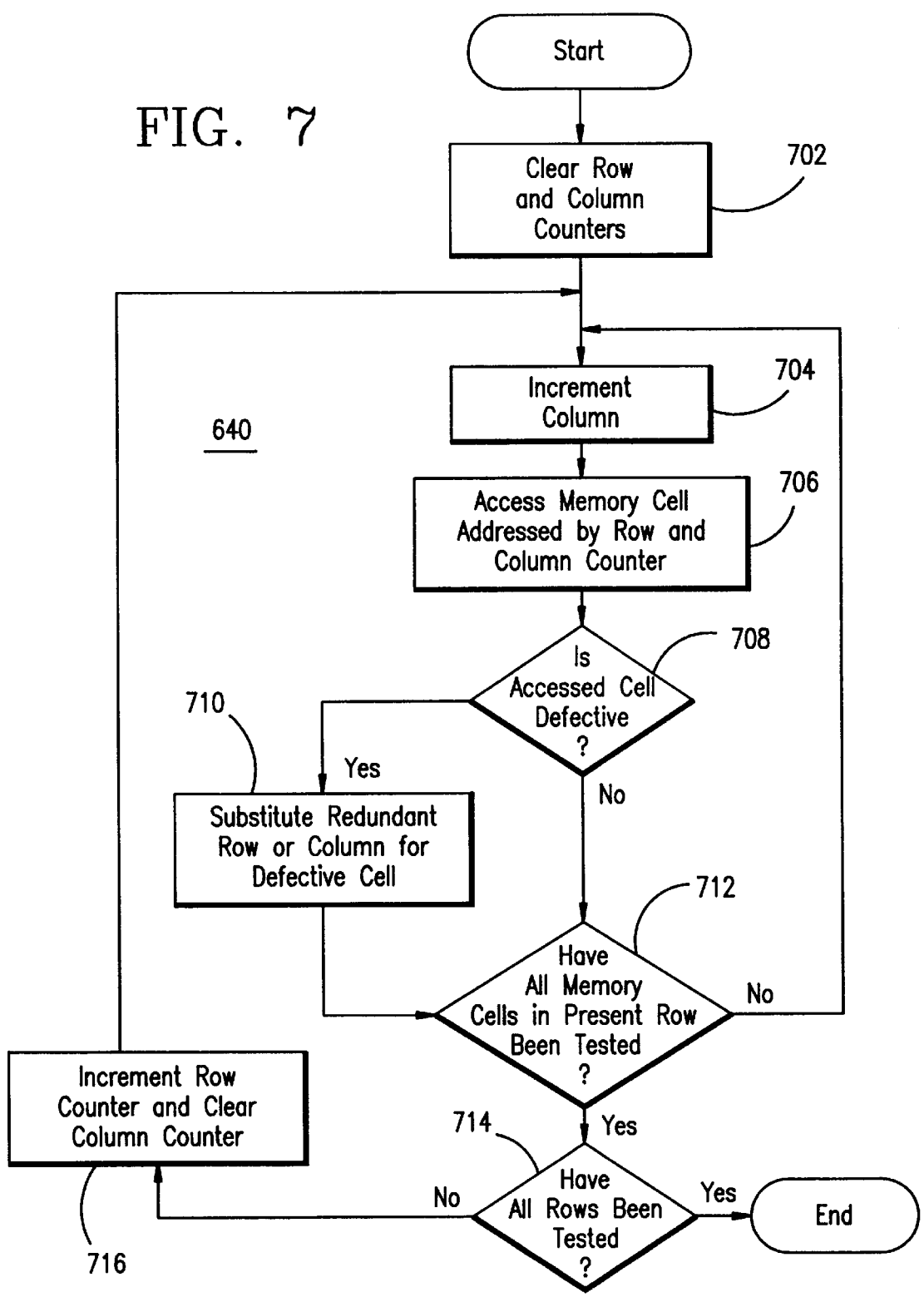

FIGS. 6A, 6B, and 7 together constitute a flow chart illustrating the preferred operation of the present invention.

Control circuitry 222 initiates a repair test cycle by clearing counters 216 and 218 (step 602). In steps 604 through 618, the testing circuitry sequentially accesses and determines if each memory cell in a row is defective. Specifically, column counter 216 is incremented (step 604) to generate the memory cell address to be accessed (step 606). Failure detection circuitry 224 then determines whether the accessed memory cell is defective (step 608), and if so, it increments counter 220 (step 612). The process is repeated until all the memory cells in a row have been accessed (step 610). When a row has been completed, the system determines if the row is a must-repair (step 614), and if so, circuitry 222 operates repair circuitry 223 to substitute a redundant row for the failed row (step 616) and to correspondingly reduce a count of the number of available redundant rows by one (step 617). Counter 220 is then cleared (step 618).

The testing circuitry repeats steps 604 through 618 for each row in the quadrant (steps 620 and 622). When all the row must-repairs have been tested, the system locates must-repairs in the column direction (process 630). Process 630 includes steps similar to that performed by steps 602 through 622, except that the role of the row and column counter are reversed.

Although the process shown in FIGS. 6A and 6B is described as performing a complete must-repair test cycle by first indexing the memory array in row-major order and then in column-major order, this indexing order could be reversed.

After all must-repairs have been found, the system may execute optional process 635 to find preferred-repairs. Process 635 comprises steps almost identical to those performed in steps 602 through 630 for the must-repair case, with the difference that the predetermined value used to identify failing preferred rows and columns is a held constant throughout the process. That is, step 617 is not executed when preferred-repairs are located.

Process 640, shown in detail in FIG. 7, repairs the remaining non-must-repair and non-preferred-repair cell defects that may still exist after process 635 has been completed. Control circuitry 222 initiates process 640 by clearing counters 216 and 218 (step 702). Column counter 216 is incremented (step 704) to generate the memory cell address to be accessed (step 706). The testing circuitry then determines whether the accessed memory cell is defective (step 708), and if so, repair circuitry 223 is operated to substitute a redundant row or column for the defective cell (step 710). Steps 704 through 710 are performed for every memory cell in the quadrant (steps 712, 714, and 716).

Although process 640 is shown as accessing the memory quadrant in row-major order, a column-major order access could also be used.

Whether a redundant row or column is substituted in step 710 is immaterial, but there must be at least one redundant row or column available. If a defective memory cell is found and there are no remaining redundant rows or columns, the memory array is defective. An impaired memory array, however, may still be useable to some extent through a process called partialing. In partialing, blocks of memory cells that include defective cells are isolated. In this manner, a memory device with defective memory cells may still be used, albeit with a reduced memory capacity.

It will be apparent to those skilled in the art that various modifications and variations can be made to the present invention without departing from the scope or spirit of the invention. For example, although above embodiments were described with reference to a DRAM, the concepts disclosed herein could also be applied to testing of any semiconductor memory such as static random access memories (SRAMs). The concepts of the invention may also be applied to non-semiconductor memories as well. Additionally, although the present test circuitry repaired the must repairs as soon as they were identified, the failed must-repair addresses could instead be stored in an address queue for later repair or transmission off chip.

Other embodiments of the invention will be apparent to those skilled in the art from consideration of the specification and practice of the invention disclosed herein. The specification and examples are exemplary only. The true scope and spirit of the invention is instead indicated by the following claims and their equivalents.

What is claimed is:

1. A memory comprising:
    a memory array addressable with row and column addresses;
    a row counter connected to supply row addresses to the memory array;
    a column counter connected to supply column addresses to the memory array;
    control circuitry coupled to the row counter and the column counter;
    failure detection circuitry for detecting errors during memory access, the failure detection circuitry being coupled to the memory array and the control circuitry;
    a failure counter coupled to the failure detection circuitry and the control circuitry to maintain a count of errors for a column or row; and
    repair circuitry coupled to the control circuitry and the memory array and controlled by the control circuitry;
    wherein the control circuitry is configured to operate the row and column counters to access memory elements in the memory array in a predetermined column order and in a predetermined row order and to cause the repair circuitry to substitute a column or row in the memory array with a respective redundant column or row in the memory array when the failure counter reaches a predetermined threshold for a column or row, said control circuitry being configured to cause the repair circuitry to substitute the redundant column or row prior to subsequent columns or rows being accessed.

2. The memory of claim 1, wherein the predetermined threshold is a value greater than one.

3. The memory of claim 1, wherein the predetermined threshold is a value equal to the number of available redundant columns or rows, respectively.

4. A memory comprising:
    a memory array addressable by row and column addresses;
    a row counter for supplying row addresses to the memory array;
    a column counter for supplying column addresses to the memory array;
    failure detection circuitry for detecting when the row and column counters address defective memory elements in the memory array;
    means for operating the row counter, column counter and failure detection circuitry to identify a repair by accessing memory elements in a row or column direction until the failure detection circuitry detects a predetermined number of defective memory elements in a single row or column; and
    means for repairing an identified repair before the means for operating identifies a subsequent repair.

5. The memory of claim 4, wherein the identified repair is a must-repair or a preferred repair.

6. The memory of claim 4, further comprising:
    means for operating the row counter, column counter, and failure detection circuitry, after all row and column must-repairs have been identified, to locate non-must-repairs whenever the failure detection circuitry detects a defective memory element.

7. The memory of claim 4, wherein the predetermined number is an integer greater than one.

8. A method of repairing one of must-repairs and preferred-repairs oriented in a selected one of a row direction or a column direction, within a memory array on a semiconductor chip, comprising the steps of:
    selecting a row or column within the memory array;
    accessing the memory cells in the selected row or column of the memory array;
    comparing the content of each of the accessed memory cells direction with respective test values supplied to the memory cells;
    storing a running total of the number of dissimilar comparisons performed by the comparing step in the selected row or column;
    repairing the selected row or column when the running total equals or exceeds a predetermined number before accessing subsequent rows or columns; and
    repeating the selecting, accessing, comparing, storing and repairing steps for each row or column in the memory array.

9. A method of repairing a memory array fabricated on a semiconductor chip, comprising the steps of:
    accessing a row of memory locations in a quadrant of the memory array;
    determining whether an accessed memory location in the row is a failure;
    repeating said determining step for each memory location along the row;

repairing a row with a redundant row when the number of failures within a single row equals or exceeds a first predetermined value prior to accessing memory locations in a subsequent row;

repeating the previous four steps for each row in the quadrant;

accessing a column of memory locations in the quadrant of the memory array;

determining whether an accessed memory location in the column is a failure;

repeating said determining step for each memory location along the column;

repairing a column with a redundant column when the number of failures within a single column equals or exceeds a second predetermined value prior to accessing memory locations in a subsequent column.

10. The method of claim 9, wherein the first and second predetermined values are integers greater than one.

11. The method of claim 9, further comprising the steps of:

sequentially accessing memory locations in the quadrant of the memory array in one of column-major order and row-major order;

determining if each accessed memory location in one of column-major order and row-major order is a failure; and repairing the accessed memory location when the memory location is determined to be a failure.

12. An integrated circuit comprising:

a memory array addressable with row and column addresses;

a row counter connected to supply row addresses to the memory array;

a column counter connected to supply column addresses to the memory array;

control circuitry coupled to the row counter and the column counter, the control circuitry being configured to operate the row and column counters to access memory elements in the memory array in a predetermined column order and in a predetermined row order;

failure detection circuitry for detecting errors during memory access, the failure detection circuitry being coupled to the memory array and control circuitry a failure counter coupled to the control circuitry and the failure detection circuitry to maintain a count of errors for a column or row; and repair circuitry coupled to the control circuitry and the memory array and controlled by the control circuitry to substitute a row or column in the memory array with a respective redundant row or column in the memory array if the failure counter reaches a predetermined threshold for a column or row before subsequent columns or rows are accessed.

13. The integrated circuit of claim 12, wherein the predetermined threshold is equal to the number of available redundant rows or columns, respectively.

14. The integrated circuit of claim 12, wherein the predetermined threshold is a value greater than one.

15. An integrated circuit comprising:

a memory array addressable by row and column addresses;

a row counter for supplying row addresses to the memory array;

a column counter for supplying column addresses to the memory array; and failure detection means for detecting when the row and column counters address defective memory elements in the memory array;

a means for operating the row counter, column counter and failure detection circuitry to access memory elements in a row or column direction and identify a repair to a row or column when the failure detection means detects a predetermined number of defective memory elements in a single row or column; and a means for repairing the identified repair before the means for operating identifies a subsequent repair.

16. The integrated circuit of claim 15, wherein the means for operating accesses memory elements in both row and column directions.

17. The integrated circuit of claim 16, wherein the identified repair is a must-repair or a preferred repair.

18. The integrated circuit of claim 17, further comprising means for operating the row counter, column counter, and failure detection means, after all row and column must-repairs have been identified, to locate non-must-repairs whenever the failure detection means detects a defective memory element.

19. The integrated circuit of claim 15, wherein the predetermined number is an integer greater than one.

20. The integrated circuit of claim 15, wherein the predetermined number is equal to the number of available redundant columns or rows, respectively.

* * * * *